(12) United States Patent
Obermeier et al.

(10) Patent No.: US 6,395,653 B1
(45) Date of Patent: May 28, 2002

(54) SEMICONDUCTOR WAFER WITH CRYSTAL LATTICE DEFECTS, AND PROCESS FOR PRODUCING THIS WAFER

(75) Inventors: Gunther Obermeier, Kirchweidach (DE); Alfred Buchner, Pischelsdorf (AT); Theresia Bauer, Burgkirchen (DE); Jürgen Hage, Mehring-Öd (DE); Rasso Ostermeir, Kottgeisering (DE); Wilfried Von Ammon, Hochburg-Ach (AT)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/575,281

(22) Filed: May 22, 2000

(30) Foreign Application Priority Data

May 28, 1999 (DE) .......................... 199 25 044

(51) Int. Cl.⁷ ................ H01L 21/26; H01L 21/324; H01L 21/42; H01L 21/477
(52) U.S. Cl. .............. 438/795; 438/795; 438/499; 438/501; 438/502; 438/308
(58) Field of Search .................. 438/795, 925, 438/497–509, 308

(56) References Cited

U.S. PATENT DOCUMENTS

| | | | | |
|---|---|---|---|---|
| 5,327,007 A | * | 7/1994 | Imura et al. ............... | 257/610 |
| 5,445,975 A | * | 8/1995 | Gardner et al. ............. | 437/10 |
| 5,502,010 A | * | 3/1996 | Nadahara et al. .......... | 437/247 |
| 5,534,294 A | * | 7/1996 | Kubota et al. .............. | 427/255 |
| 5,882,989 A | * | 3/1999 | Falster ....................... | 438/473 |
| 6,139,625 A | * | 10/2000 | Tamatsuka et al. .......... | 117/19 |
| 6,162,708 A | * | 12/2000 | Tamatsuka et al. ......... | 438/503 |

FOREIGN PATENT DOCUMENTS

| DE | 69213795 | 9/1996 |
|---|---|---|
| EP | 0507400 | 9/1996 |
| WO | 98/38675 | 9/1998 |

OTHER PUBLICATIONS

W. Zulehner and D. Huber, Czochralski–Grown Silicon, Crystals 8, Springer Verlag Berlin–Heidelberg, 1982.
"Oxygen in Silicon", F. Shimura, Semiconductors and Semimaterials vol. 42, Academic Press, San Diego, 1994.
Vanhellemont et al., J. Appl. Phys. 62, p. 3960, 1987.
R.S. Hockett, Appl. Phys. Lett. 48, 1986, p. 224.

* cited by examiner

*Primary Examiner*—Matthew Smith
*Assistant Examiner*—Granvill D. Lee, Jr.
(74) *Attorney, Agent, or Firm*—Collard & Roe, P.C.

(57) ABSTRACT

A semiconductor wafer has a front side 1, a back side 2, a top layer 3, a bottom layer 4, an upper inner layer 5 lying beneath the top layer 3, an lower inner layer 6 lying above the bottom layer 4, a central region 7 between the layers 5 and 6, and an uneven distribution of crystal lattice defects. The crystal lattice defects are substitutionally or interstitially included nitrogen or vacancies.

8 Claims, 1 Drawing Sheet

US 6,395,653 B1

SEMICONDUCTOR WAFER WITH CRYSTAL LATTICE DEFECTS, AND PROCESS FOR PRODUCING THIS WAFER

BACKGROUND OF THE INVENTION

1. Field of the Invention the present invention relates to a semiconductor wafer with uneven distribution of crystal lattice defects, and to a process for producing this wafer.

2. The Prior Art

Silicon crystals, in particular for the production of semiconductor wafers, are preferably obtained by pulling a seed crystal from a silicon melt, which is generally provided inside a quartz glass crucible. This so-called Czochralski crucible-pulling pulling process is described in Detail in, for example, W. Zulehner and D. Huber, Czochralski-Grown Silicon, Crystals 8, Springer Verlag Berlin-Heidelberg 1982.

Due to the reaction of the quartz glass crucible with the molten silicon during the crucible-pulling process, oxygen is included as the dominant impurity in the growing silicon crystal. concentration of oxygen is usually so high that, after the crystal has cooled, it is insupersaturated form. In subsequent treatments, the oxygen is deposited in the form of oxygen cipitates. These precipitations have both advantages and disadvantages. the so-called gettering properties of the oxygen precipitates are an advantage.

This is understood to mean that, for example, metallic impurities in the semiconductor wafer are bonded to the oxygen precipitates. These impurities are thus removed from the layer which is close to the surface and is relevant for compenents. A drawback is the oxygen precipitates in the layer which is close to the surface and is relevant for componenets interfere with the function of the components which are manufactured on the semiconductor wafer. Consequentlly, it is desirable for a precipitate-free zone, PFZ, also known as a denuded zone, DZ, to be formed in the vicinity of the surface. It is also desirable for a high concentration of precipitates to be formed in the interior of the semiconductor wafer, known as the bulk.

The prior art, for example in "Oygen in Silicon" F. Shimura, Semiconductors and Semimatarials Vol. 42, Academic Press, San Diego, 1994, has disclosed how the outdiffusionof the oxygen near the surface is achieved in a heat treatment at temperatures of preferably over 1100° C. As a result of this outdiffusion, the concentration of oxygen is in the layer close to the surface falls so far that there is no longer any precipitation, and consequently a PFZ is generated. This heat treatment was in most cases directly intergrated in the porcesses for producing components. In modern processes, however, these high temperatures are no longer used, and consequently the required outdiffusion is brout about by an additional heat-treatment treatment step.

The oxygen precipitation takes place substantially in two steps:

(1) formation of nucleation centers for oxygen precipitates, so-called nuclei; and (2) growth of these centers to form detectable oxygen precipitates.

During subsequent heat treatments, the size of these nuclei can be modified in such a way that those which have a larger radius than the so-called "critical radius" grow into oxygen precipitates. On the other hand, nuclei with a smaller tadius break down (are dissolved). The growth of nuclei with a radius>$r_c$ takes place at elevated temperature and is substantially limited by the diffusionof oxygen. A generally accepted model (cr., for example, Vanhellemont et al., *J. Appl. Phys.* 62, p. 3960, 1987) describes the critical radius $r_c$ as a function of the temperature, the oxygen supersaturation and the concentration of vacancies. concentration is understood to mean particles per unit volume. A high oxygen concentrationand/or a high vacancy supersaturation simplifies or accelerates the precipitation of oxygen and leads to a higher concentration of precipitates. Furthermore, the concentration or size of the precipates, in particular in semiconductor wafers, depends on heating and cooling rates during thermalfurnace processes, in particular during the so-called RTA (rapid thermal annealing) processes or an epitaxial deposition of a thin crystalline film on the wafer. During these heat treatments, semiconductor wafers are heated to temperatures of up to 1300° C. within a few seconds and are then cooled at rates of up to 300° C./sec.

The oxygen concentration, the vacancy concentration, the interstitial concentration, the dopant concentration and the concentration of existing precipitation nuclei, such as for example carbon atoms, also influence the precipitation of oxygen.

WO 98/38675 discloses a semiconductor wafer with an uneven distribution of crystal lattice vacancies, which is obtained by means of heat treatment. The maximum level of this vacancy profile generated in this way is situated in the bulk of the semiconductor wafer and the profile decreases considerably toward the surfaces. During subsequent heat-treatment processes, in particular 800° C. for 3 h and 1000° C. for 16 h, the oxygen precipitation follows this profile. The result is a PFZ without prior outdiffusion of the oxygen and oxygen precipitates in the bulk of the semiconductor wafer. According to WO 98/38675, the concentration of oxygen precipitates is set by means of the concentration of vacancies, and the depth of the precipitates is set by means of the cooling rate following the heat treatment. A drawback of this semiconductor wafer is that vacancies in the crystal lattice have proven highly mobile, in particular during a heat treatment at temperatures >1000° C. Consequently, the profile of the vacancies becomes "blurred", and consequently so does the profile of the oxygen precipitates during subsequent heat treatments.

If oxygen-containing semiconductor wafers, which have neither been subjected to a high-temperature process of >1050° C. for outdiffusion of the oxygen nor to a heat treatment as described in WO 98/38675, are subjected to a heat treatment in a temperature range of preferably between 450° C. and 850° C. for preferably a few hours, subsequent heat treatments, for example at 780° C. for 3 h and 1000° C. for 16 h, do not produce a PFZ. Instead of producing a PFZ rather only a homogeneous precipitate density is produced in the silicon wafer. This means that a homogeneous concentration of the nucleation centers for the subsequent oxygen concentration is all that has been achieved by the treatment in the range of preferably between 450° C. and 850° C.

SUMMARY OF THE INVENTION

Therefore, it is an object of the present invention to provide a semiconductor wafer, and a process for producing this wafer, which has a stable profile of nucleation centers for oxygen precipitates and can thus be used as a basis for a semiconductor wafer with an improved internal gettering action.

This object is achieved according to the invention by means of a semiconductor wafer having a frontside 1, a back side 2, a top layer 3, a bottom layer 4, an upper inner layer 5 lying beneath the top layer 3, a lower inner layer 6 lying above the bottom layer 4, a central region 7 between the layers 5 and 6, and an uneven distribution of crystal lattice defects, wherein the crystal lattice defects are substitutionally or interstitially included nitrogen or vacancies.

The concentration of nitrogen preferably exhibits a maximum ($max_1$) in the central region 7 and preferably decreases uniformly toward the front side 1 and toward the rear side 2. At its maximum ($max_1$), the concentration of the nitrogen is preferably between $10^{11}$ and $10^{15}$ atoms/cm$^1$.

BRIEF DESCRIPTION OF THE DRAWINGS

Other objects and features of the present invention will become apparent from the following detailed description considered in connection with the accompanying drawing which discloses an embodiment of the present invention. It should be understood, however, that the drawing is designed for the purpose of illustration only and not as a definition of the limits of the invention.

In the drawing, the one figure shows a cross sectional view of a wafer according to the invention.

DETAILED DESCRIPTION OF PREFERRED EMBODIMENTS

Figure 1:
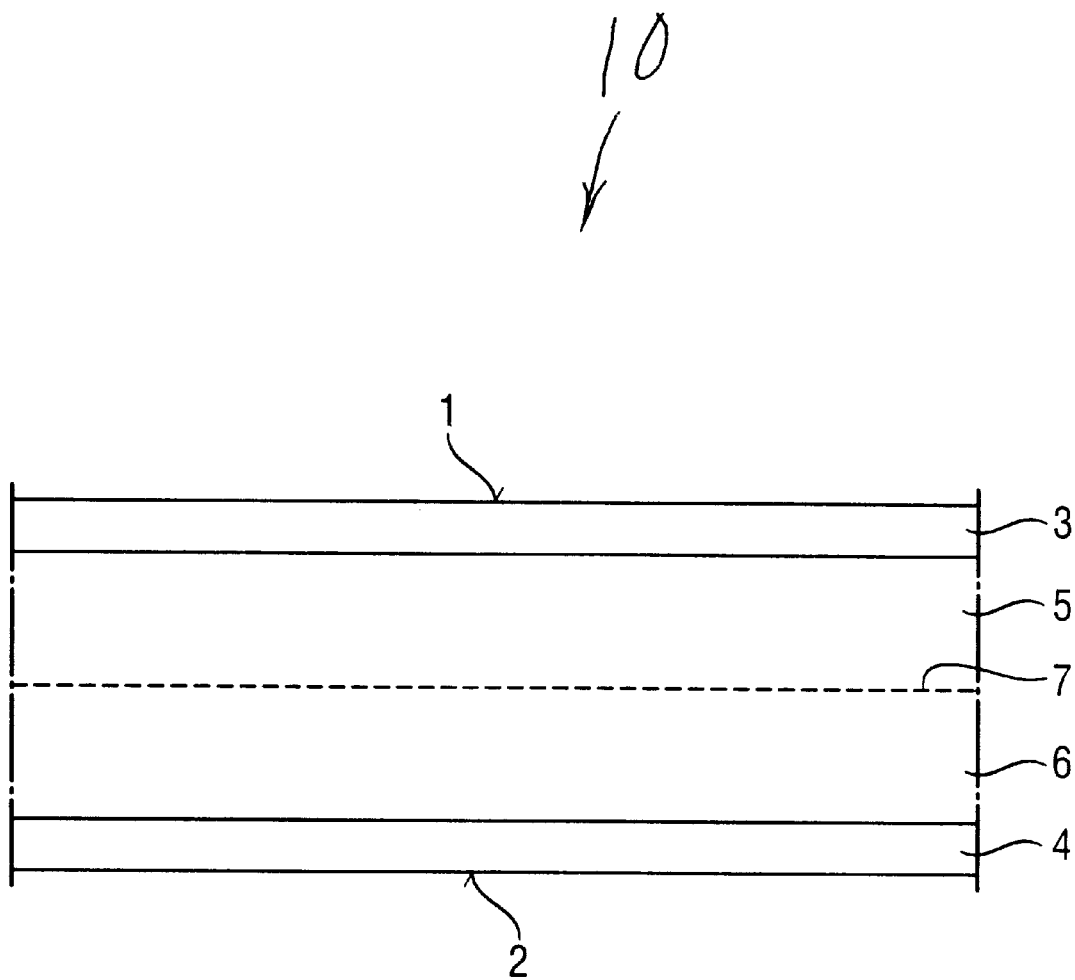

FIG. 1 shows the layers defined above as well as the front side 1, the back side 2 and the central region 7 between the layers 5 and 6 of a semiconductor wafer 10. The top layer 3 is preferably between 0 and 100 μm thick, the upper inner layer 5 is preferably between 15 and 330 μm thick, the lower inner layer 6 is preferably between 100 and 300 μm thick, and the bottom layer 4 is preferably between 0 and 250 μm thick.

The object of the present invention is also achieved by means of a process for producing a semiconductor wafer having a front side 1, a back side 2, a top layer 3, a bottom layer 4, an upper inner layer 5 lying beneath the top layer 3, a lower inner layer 6 lying above the bottom layer 4, a central region 7 between the layers 5 and 6, and an uneven distribution of substitutionally or interstitially included nitrogen, wherein a nitrogen-doped semiconductor wafer is subjected to a heat treatment for from 1 to 360 sec at a temperature of between 800° C. and 1300° C.

The doped semiconductor wafer has a nitrogen concentration of preferably $10^{12}$ to $3\times10^{15}$ atoms/cm$^3$ and particularly preferably of $2\times10^{13}$ atoms/cm$^3$ to $4\times10^{14}$ atoms/cm$^3$, and an oxygen concentration of preferably $1\times10^{17}$ to $1\times10^{18}$ atoms/cm$^3$, and particularly preferably from $2\times10^{17}$ to $6.5\times10^{17}$ atoms/cm$^3$. Semiconductor wafers of this nature can be obtained from nitrogen-doped crystal rods, which are described, for example, in R. S. Hockett, *Appl. Phys. Lett.* 48, 1986, p. 224.

The heat treatment is preferably carried out under a process gas atmosphere. The process gas is preferably selected from a group of gases consisting of oxygen, nitrogen, hydrogen and the inert gases, as well as any desired mixtures and any chemical compounds of these gases. The process gas preferably has oxidizing properties. After the heat treatment, cooling rates of preferably between 1 and 300° C./s, particularly preferably between 100° C./s and 250° C./s and in particular between 75° C./s and 200° C./s, are set in the temperature range from 1300° C. to 800° C. The concentration and depth of the defects are controlled by means of the cooling rates.

According to the invention, in a nitrogen-doped semiconductor wafer, a nitrogen concentration profile is generated by means of diffusion processes during a heat treatment. The concentration of nitrogen exhibits a maximum ($max_1$) in the central region 7 and decreases, preferably uniformly, toward the front side 1 and toward the back side 2. The nitrogen concentration at its maximum ($max_1$) is preferably from $10^{12}$ to $10^{15}$ atoms/cm.

Surprisingly, this profile of the uneven distribution of substitutionally or interstitially included nitrogen can be converted, in a subsequent heat treatment, to a corresponding profile of an uneven distribution of nucleation centers for oxygen precipitates.

Accordingly, the object of the present invention is also achieved by means of a semiconductor wafer having a front side 1, a back side 2, a top layer 3, a bottom layer 4, an upper inner layer 5 lying below the top layer 3, a lower inner layer 6 lying above the bottom layer 4, a central region 7 between the layers 5 and 6 and an uneven distribution of nucleation centers for oxygen precipitates, wherein the concentration of the nucleation centers exhibits a maximum ($max_1$) in the central region 7. The concentration of nucleation centers on the front side 1, the back side 2, in the top layer 3 and the bottom layer 4 is so low that, during a subsequent heat treatment, precipitate-free layers are formed on the front side 1 and the back side 2, in a thickness of from 1 to 100 μm, without oxygen diffusing out.

The object of the present invention is also achieved by means of a process for producing a semiconductor wafer with an uneven distribution of nucleation centers for oxygen precipitates, wherein a semiconductor wafer with an uneven distribution of substitutionally or interstitially included nitrogen is or with uneven distribution of vacancies subjected to a heat treatment at a temperature of between 300° C. and According to the present invention, a semiconductor wafer which has a nitrogen concentration profile is converted into a semiconductor wafer with an uneven distribution of nucleation enters for oxygen precipitates during a heat treatment. The concentration of nucleation centers exhibits a maximum ($max_1$) in the central region 7. On the front side 1, the back side 2, in the top layer 3 and the bottom layer 4, the concentration of nucleation centers is so low that, during a subsequent heat treatment, precipitate-free layers are formed on the front side 1 and the back side 2, in a thickness of from 1 to 100 μm, without oxygen diffusing out.

The heat treatment is preferably carried out under a process gas atmosphere. The process gas is preferably selected from a group of gases consisting of oxygen, nitrogen, hydrogen and the inert gases, as well as any desired mixtures and any desired chemical compounds of the above-mentioned gases. The heat treatment preferably lasts for between 15 and 360 min.

Accordingly, the object is also achieved by means of a semiconductor wafer with an uneven distribution of nucleation centers for oxygen precipitates.

Surprisingly, it has been found that the nucleation centers are not mobile point defects, but rather immobile deposits. According to the invention, therefore, the oxygen precipitation precisely follows the profile of these immobile deposits during Subsequent heat treatments, for example during a heat treatment that 780° C. for 3 h and 1000° C. for 16 h. Accordingly, the object is also achieved by means of a semiconductor wafer with an uneven distribution of nucleation centers for oxygen precipitates.

According to the present invention, this heat treatment at preferably 780° C for 3 h and 1000° C. for 16 h results in a precipitate-free layer on that side of the semiconductor wafer which is active for components, with a thickness of preferably from 1 to 100 μm, without complex oxygen outdiffusion steps having to be carried out. The bulk of the semiconductor wafer contains oxygen precipitates in a concentration of typically $1\times10^8$ to $1\times10^{11}$ cm$^{-3}$, so that the internal gettering of impurities is ensured.

Accordingly, while a few embodiments of the present invention have been shown and described, it is to be understood that many changes and modifications may be made thereunto without departing from the spirit and scope of the invention as defined in the appended claims.

What is claimed is:

1. A semiconductor wafer comprising a front side, a back side, a top layer, a bottom layer, an upper inner layer lying beneath the top layer, a lower inner layer lying above the bottom layer, a central region between the upper inner layer and the lower inner layer, and an uneven distribution of crystal lattice defects, and said uneven distribution having a profile, wherein the crystal lattice defects are selected from the group consisting of substitutionally included nitrogen and interstitially included nitrogen, and said profile of the uneven distribution of substitutionally or interstitially included nitrogen being converted, in a subsequent heat treatment, to a corresponding profile of an uneven distribution of nucleation centers for oxygen precipitates.

2. The semiconductor wafer as claimed in claim 1, wherein there is a concentration of nitrogen which exhibits a maximum (max$_1$) in the central region and decreases toward the front side and toward the back side.

3. The semiconductor wafer as claimed in claim 1, wherein there is a concentration of nitrogen which is a maximum (max$_1$) of between $10^{11}$ and $10^{15}$ atoms/cm$^3$.

4. A process for producing a semiconductor wafer comprising subjecting a nitrogen-doped semiconductor wafer to a heat treatment for from 1 to 360 sec at a temperature of between 800° C. and 1300° C.; and wherein said semiconductor wafer comprises a front side, a back side, a top layer, a bottom layer, an upper inner layer lying beneath the top layer, a lower inner layer lying above the bottom layer, a central region between said upper inner layer and said lower inner layer, and an uneven distribution of crystal lattice defects, and said uneven distribution having a profile, and wherein the crystal lattice defects are selected from the group consisting of substitutionally included nitrogen and interstitially included nitrogen; and said profile of the uneven distribution of substitutionally or interstitially included nitrogen being converted, in a subsequent heat treatment, to a corresponding profile of an uneven distribution of nucleation centers for oxygen precipitates.

5. The process as claimed in claim 4, wherein, after the heat treatment, in the temperature range of from 1300° C. to 800° C., maintaining pooling rates of from to 300° C./sec.

6. A semiconductor wafer comprising a front side, a back side, a top layer, a bottom layer, an upper inner layer lying below the top layer, a lower inner layer lying above the bottom layer, a central region between said upper inner layer and said lower inner layer and an uneven distribution of crystal lattice defects, and said uneven distribution having a profile, and wherein the crystal lattice defects are selected from the group consisting of substitutionally included nitrogen and interstitially included nitrogen;

said profile of the uneven distribution of substitutionally or interstitially included nitrogen being converted in a subsequent heat treatment to a corresponding profile of an uneven distribution of nucleation centers for oxygen precipitates, wherein the concentration of the nucleation centers exhibits a maximum (max$_1$) in the central region; and the concentration of nucleation centers on the front side, the back side, in the top layer and the bottom layer is so low that, during said subsequent heat treatment, precipitate-free layers are formed on the front side and the back side, in a thickness of from 1 to 100 μm, without oxygen diffusing out.

7. A process for producing a semiconductor wafer comprising subjecting a semiconductor wafer with an uneven distribution of nitrogen and said uneven distribution having a profile and being selected from the group consisting of substitutionally included nitrogen and interstitially included nitrogen to a heat treatment at a temperature of between 300° C. and 1000° C.; and wherein the semiconductor wafer comprises a front side, a back side, a top layer, a bottom layer, an upper inner layer lying below the top layer, a lower inner layer lying above the bottom layer, a central region between said upper inner layer and said lower inner layer and said profile of the uneven distribution of substitutionally or interstitially included nitrogen being converted, in a subsequent heat treatment, to a corresponding profile of an uneven distribution of nucleation centers for oxygen precipitates, wherein the concentration of the nucleation centers exhibits a maximum (max$_1$) in the central region; and the concentration of nucleation centers on the front side, the back side, in the top layer and the bottom layer is so low that, during said subsequent heat treatment, precipitate-free layers are formed on the front side and the back side, in a thickness of from 1 to 100 μm, without oxygen diffusing out.

8. The process as claimed in claim 7, wherein the heat treatment lasts for between 15 and 360 min.

* * * * *